United States Patent
Walker

(10) Patent No.: US 11,829,196 B2
(45) Date of Patent: Nov. 28, 2023

(54) RING TRANSPORT EMPLOYING CLOCK WAKE SUPPRESSION

(71) Applicant: ADVANCED MICRO DEVICES, INC., Santa Clara, CA (US)

(72) Inventor: William L. Walker, Fort Collins, CO (US)

(73) Assignee: Advanced Micro Devices, Inc., Santa Clara, CA (US)

(*) Notice: Subject to any disclaimer, the term of this patent is extended or adjusted under 35 U.S.C. 154(b) by 505 days.

(21) Appl. No.: 16/659,978

(22) Filed: Oct. 22, 2019

(65) Prior Publication Data
US 2021/0116956 A1    Apr. 22, 2021

(51) Int. Cl.
| | |
|---|---|
| *G06F 1/08* | (2006.01) |
| *G06F 1/06* | (2006.01) |
| *G01R 31/28* | (2006.01) |
| *G01R 31/3185* | (2006.01) |

(52) U.S. Cl.
CPC .......... *G06F 1/08* (2013.01); *G01R 31/2896* (2013.01); *G01R 31/318552* (2013.01); *G06F 1/06* (2013.01)

(58) Field of Classification Search
CPC ...................................... G06F 1/08; G06F 1/06
See application file for complete search history.

(56) References Cited

U.S. PATENT DOCUMENTS

| | | | | |
|---|---|---|---|---|
| 5,333,271 A | * | 7/1994 | Fredericks ............ | G06F 13/122 709/231 |
| 6,091,705 A | * | 7/2000 | Regula .................... | G01R 31/08 370/223 |
| 6,442,722 B1 | * | 8/2002 | Nadeau-Dostie ............................ | G01R 31/31858 714/731 |
| 8,050,256 B1 | * | 11/2011 | Bao ........................ | H04L 45/126 370/386 |
| 9,571,341 B1 | * | 2/2017 | Kumar .................... | G06N 5/045 |

(Continued)

FOREIGN PATENT DOCUMENTS

| | | |
|---|---|---|
| CN | 106815064 A | 6/2017 |
| CN | 106899472 A | 6/2017 |
| CN | 104205082 B | 11/2017 |

OTHER PUBLICATIONS

International Search Report and Written Opinion dated Feb. 15, 2021 in Application No. PCT/US2020/056851, 9 pages.

(Continued)

*Primary Examiner* — Phil K Nguyen

(57) ABSTRACT

An integrated circuit (IC) device includes a ring transport having a plurality of nodes and a wire interconnect coupling the plurality of nodes in a ring. The wire interconnect including a wire to transmit clock wake signals around the ring transport in advance of data signaling representing a data packet. Each node is to switch from a clock gated state to a clocked state responsive to receiving a clock wake signal. The ring transport further includes a sleep controller coupled to a select node of the plurality of nodes. The sleep controller is to configure the select node into a clock suppression state for a specified duration responsive to identifying an idle condition on the ring transport via monitoring of the wire. While in the clock suppression state the node suppresses further transmission of any clock wake signals received at the select node.

20 Claims, 3 Drawing Sheets

(56) References Cited

U.S. PATENT DOCUMENTS

| | | | |
|---|---|---|---|
| 10,452,124 B2* | 10/2019 | Bauman | G06F 15/7825 |
| 2004/0268091 A1* | 12/2004 | Pessolano | G06F 9/30083 |
| | | | 712/215 |
| 2005/0147081 A1* | 7/2005 | Acharya | H04L 45/00 |
| | | | 370/351 |
| 2006/0041715 A1 | 2/2006 | Chrysos et al. | |
| 2006/0112292 A1* | 5/2006 | Lin | G06F 1/3215 |
| | | | 713/320 |
| 2011/0016242 A1* | 1/2011 | Hara | G06F 13/42 |
| | | | 710/107 |
| 2011/0022754 A1* | 1/2011 | Cidon | G06F 15/7825 |
| | | | 710/107 |
| 2012/0210104 A1* | 8/2012 | Danko | G06F 1/3203 |
| | | | 712/E9.035 |
| 2015/0046626 A1* | 2/2015 | Cowell | G06F 13/4068 |
| | | | 710/313 |
| 2018/0107599 A1 | 4/2018 | Chuang | |
| 2019/0339733 A1* | 11/2019 | Lee | G06F 1/324 |

OTHER PUBLICATIONS

International Preliminary Report on Patentability dated May 5, 2022 for PCT/US2020/056851, 6 pages.

* cited by examiner

RING TRANSPORT EMPLOYING CLOCK WAKE SUPPRESSION

BACKGROUND

Integrated circuit (IC) devices often use a ring transport to communicate data and commands among various components connected to the ring transport. A common ring transport configuration employs a clock wake signal that precedes each packet by one or more clock cycles in the ring transport. Receipt of the clock wake signal at a node in the ring transport serves to activate the stage in preparation for receipt of the following packet. However, such clock wake signals often can circle around the ring transport indefinitely, and eventually each node becomes constantly clocked. This prevents the nodes from entering a low power mode and thus causes the ring transport to consume excess power.

BRIEF DESCRIPTION OF THE DRAWINGS

The present disclosure is better understood, and its numerous features and advantages made apparent to those skilled in the art by referencing the accompanying drawings. The use of the same reference symbols in different drawings indicates similar or identical items.

DETAILED DESCRIPTION

Clock distribution for the components of a ring transport often consumes considerable power, and this power consumption is exacerbated by conventional implementations in which errant clock wake signals circle the ring transport indefinitely, leading to a ring transport that is full of clock wake signals and thus continuously clocked. The following disclosure describes systems and techniques for reduced power consumption in a ring transport through implementation of a sleep controller that serves to suppress, or "squash", errant clock wake signals traveling through the ring transport. In suppressing these errant clock wake signals, the nodes of the ring transport can switch to an unclocked state, and thus reduce their power consumption, while the ring transport is idle.

In at least one embodiment, the ring transport includes a plurality of nodes connected into a ring via a wire interconnect composed of a plurality of wires, including wires for conducting control signaling and wires for conducting data signaling. A sleep controller is connected to a select node and operates to control operation of the node with regard to forwarding, or "repeating", clock wake signals received at the node. The sleep controller monitors the wire interconnect at the controlled node for clock wake signals and data packets. After a specified idle duration at the node in which no data traffic has been received by the node, the sleep controller configures the node into an active clock suppression state in which the node is controlled so as to suppress any received clock wake signals (that is, to refrain from forwarding any received clock wake signals). In at least one embodiment, the sleep controller maintains the node in this clock suppression state for a duration sufficient to clear any errant clock wake signals traveling around the ring transport. After lapse of the specified duration for the clock suppression state, the sleep controller enters a dormant state in which the node is permitted to forward any newly received clock wake signal, and if the clock wake signal is followed by a data packet, the sleep controller reverts to an active state in which the node is controlled to implement active operation.

In this manner, the sleep controller acts via the controlled node to actively clear errant clock wake signals from the ring transport following an idle period, and then reverts to a state in which the node can react to a new clock wake signal appearing on the ring transport, which is a likely indication of the start up of data traffic again on the ring transport. Through this active clock wake signal suppression, the ring transport is allowed to switch to an actual idle state in the absence of errant clock signals, and thus the nodes can remain in an unclocked state, with commensurate reduction in power reduction, during this idle state.

Figure 1:
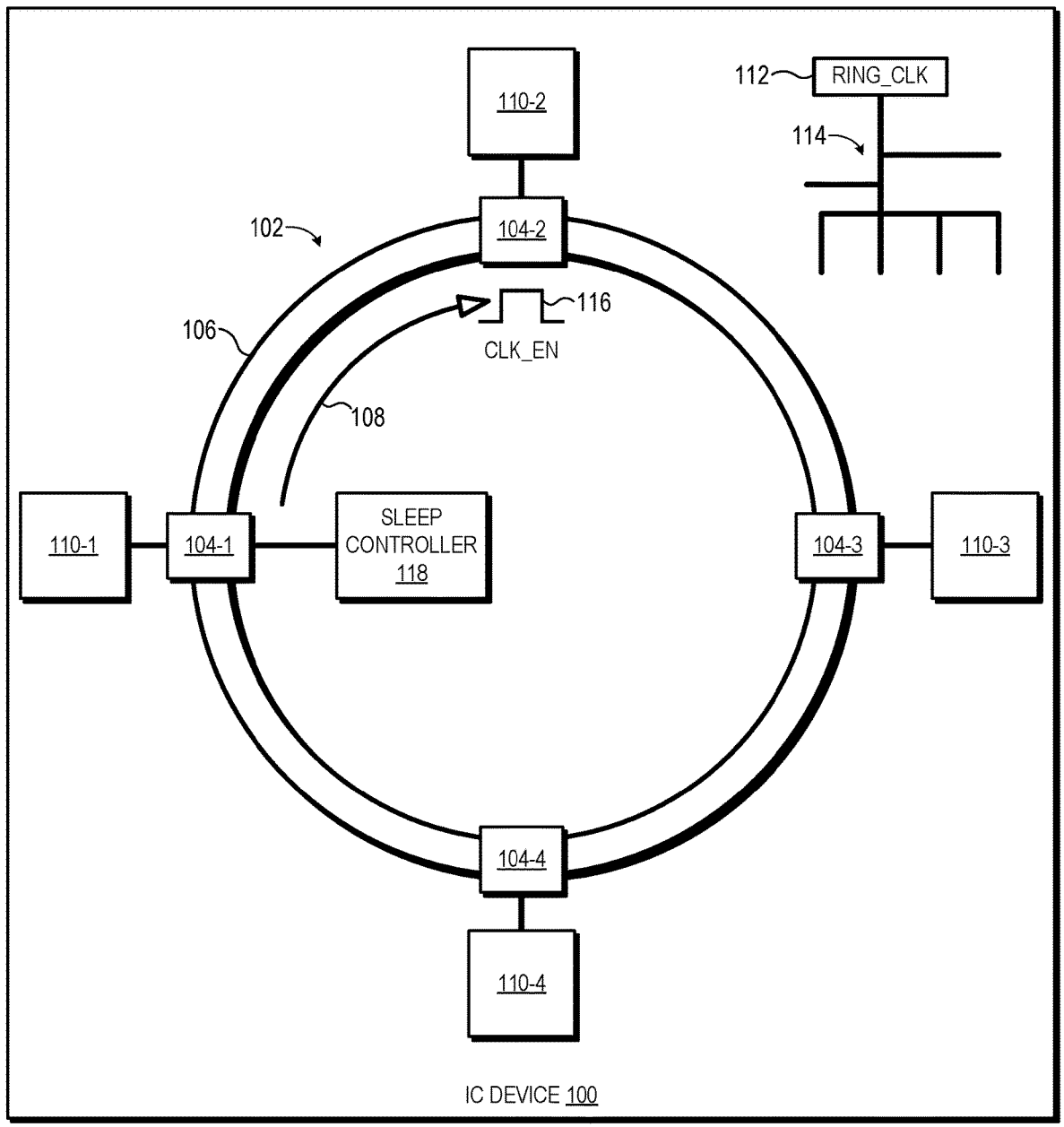
FIG. 1 is a block diagram illustrating an integrated circuit (IC) device having a double-buffered ring transport with a sleep controller in accordance with some embodiments of the present disclosure.

FIG. 1 illustrates an integrated circuit (IC) device 100 having a ring transport 102 employing active clock wake suppression in accordance with some embodiments. The IC device 100 can include a single IC chip, such as a system-on-a-chip (SoC), an application-specific integrated circuit (ASIC), and the like, or multiple IC chips mounted on a common substrate, circuit board, or other carrier, such as a multi-chip module (MCM). Examples of the IC device 100 include central processing units (CPUs), graphics processing units (GPUs), accelerated processing units (APUs), digital signal processors (DSPs), or other processors, as well as other systems typically implemented on one or more IC chips.

The ring transport 102 includes a plurality of nodes 104, such as the depicted four nodes 104-1 to 104-4, connected via a wire interconnect 106 into a ring shape such that control and data signaling is transmitted node-to-node in a single direction (e.g., clockwise direction 108) for a uni-directional ring implementation or in either direction for a bi-directional ring implementation. This control and data signaling continue to circle around the ring shape until consumed or suppressed at one of the nodes 104. Each node 104 is connected to one or more components 110 of the IC device 100, such as components 110-1 to 110-4 connected to nodes 104-1 to 104-4, respectively. These components 110 operate to one or both of inject data traffic into the ring transport 102 via the corresponding node 104 for transmission to one or more other nodes 104 or to consume data traffic being transmitted by the ring transport 102 from another node 104. The components 110 include any of a variety of elements of the IC device 100, such as processing elements, storage elements, bus or interface elements, input/output device elements, and the like.

The nodes 104 and the components 110 are clocked based on a ring clock signal 112, also referred to herein as "RING_CLK" 112, distributed among the nodes 104 and components 110 via a clock distribution tree 114. The ring clock signal 112 can be, for example, the system clock for the IC device 100, or a clock derived therefrom and particular to the ring transport 102. If the ring transport 102 and the associated components 110 remain active and thus clocked the entire time the IC device 100 is at least minimally powered, considerable power would be consumed by the clock distribution tree 114 and its clock sinks. To avoid this unnecessary power draw, the ring transport 102 employs a clock wake scheme in which the nodes 104 and the components 110 clocked by RING_CLK 112 are clock gated between transmissions of data packets on the ring transport 102. Thus, when a node is preparing to transmit a data packet on the ring transport 102, the node inserts a clock wake signal 116, also referred to herein as "CLK_EN" 116, that precedes the signaling representing the data packet by a specified number of clock cycles (e.g., 1 clock cycle). Thus, a node 104 receiving the clock wake signal 116 responds by switching from a clock gating state to a clocked state by deactivating the clock gating at the node 104 and its associated one or more components 110, and thus is ready to receive and process the data packet following the clock wake signal 116.

While the use of such clock wake signaling allows the nodes 104 to receive data traffic from upstream on short notice while also facilitating use of lower-power clock-gated idle states between data packets, the clock wake signaling often could otherwise lead to the entire ring transport 102 being continually clocked, and thus never able to enter into a lower-power idle state. To illustrate, unless a receiving node is able to determine that a given data packet is being consumed at the next node, the receiving node is unable to signal to the next node that a given clock wake signal should not be propagated further. As such, the clock wake signals that preceded a data packet could remain in the ring transport after the following data packet has been consumed and removed, and thus the ring transport 102 eventually could be "filled" with clock wake signals that effectively result in the ring transport 102 being continuously clocked. One solution to this errant clock wake signaling is the implementation of additional wires and logic to enable calculation at a given node as to whether a received data packet will be consumed and not propagated further at the next node, and using faster circuitry and wires to drive that indicator more quickly to the next node in time to enable its clocks. But such wiring and logic often is impracticable or consumes enough power to negate the power savings otherwise achievable through the clock wake scheme.

To mitigate the effect of errant clock wake signaling without relying on additional higher power wiring and logic at each node, in at least one embodiment the ring transport 102 employs a sleep controller 118 at a select one of the nodes 104 (e.g., node 104-1 in the illustrated example). In at least one embodiment, the sleep controller 118 operates to enter an active clock suppression state responsive to an idle condition at the associated node 104-1. This idle condition includes, for example, the node 104-1 being idle for a specified duration. In this active clock suppression state, the sleep controller 118 controls the node 104-1 to suppress forwarding of any received clock wake signals 116, that is, to "squash" any received clock wake signals 116 until either a valid data packet is received or a specified duration has passed. If a valid data packet is received while in the active clock suppression state, the sleep controller 118 ceases control of the node 104-1 to suppress received clock wake signals 116 and enters the normal active state. If the specified duration has passed, the sleep controller 118 enters a dormant state in which the node 104-1 is no longer being controlled to actively suppress received clock wake signals 116 (that is, the node 104-1 is permitted to forward clock wake signals 116), and thus the node 104-1 can return to an active state in response to a clock wake signal 116 and a following data packet in short order. Under this approach, the active suppression of clock wake signals 116 at the node 104-1 for the specified duration allows the node 104-1 and the sleep controller 118 to remove any errant clock wake signals 116 from the ring transport 102, and thus enter the dormant state in which the next clock wake signal 116 received should be a valid clock wake signal 116 that precedes a data packet and thus signaling that the ring transport 102 has returned to active data transmission.

Figure 2:
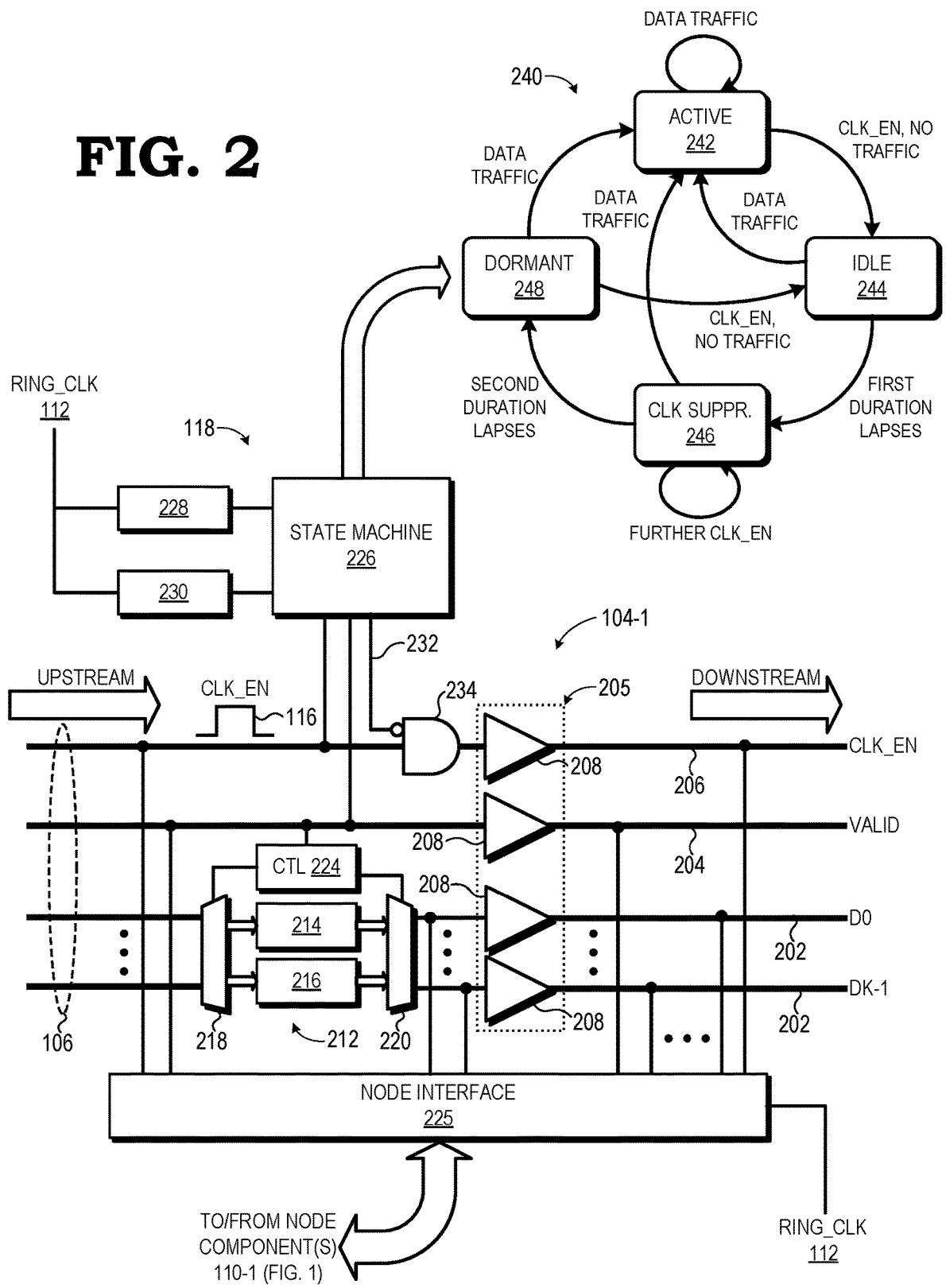
FIG. 2 is a diagram illustrating a node of the ring transport and the sleep controller of FIG. 1 in greater detail in accordance with embodiments of the present disclosure.

FIG. 2 illustrates an implementation of the node 104-1 and the sleep controller 118 of the ring transport 102 of FIG. 1 in greater detail in accordance with some embodiments. For ease of illustration, the node 104-1 and sleep controller 118 are depicted for a uni-directional ring configuration that transmits signaling in the clockwise direction 108 (FIG. 1). For a bi-directional ring configuration, it will be appreciated that the components and operations described below would be replicated for the control and data signaling traveling in the opposite direction (e.g., counter-clockwise).

In one embodiment, the wire interconnect 106 includes a plurality of wires (also commonly referred to as traces, leads, conductive lines, etc.), including wires for control signaling and wires for data signaling. The wires for data signaling include K data wires 202 to carry K data bits of a data packet (bits D0 to DK-1) in parallel (K>=1), or for a differential signaling implementation, 2*K data wires 202. The wires for control signaling include a valid wire 204 to carry a VALID signal that is asserted in conjunction with insertion of the data on the K data wires for a data packet to signal that the states of the data wires 202 represent valid data. The wires for control signaling further includes a CLK_EN wire 206 for communicating a clock wake signal 116 (e.g., a pulse or other temporary assertion of the CLK_EN wire 206) a specified number of clock cycles (e.g., one clock cycle) preceding insertion of a corresponding data packet on the data wires 202. The nodes 104, including node 104-1, implement a repeater 205 that serves to buffer, amplify, and forward the signaling of the wire interconnect 106 received at the input of the node 104. In one embodiment, the repeater 205 is implemented as a plurality of digital buffers 208, one for each wire of the wire interconnect with each digital buffer 208 having an input connected to the corresponding upstream wire segment on the input side of the node 104 and an output connected to the corresponding downstream wire segment on the output side of the node 104. Although a per-wire single digital buffer implementation is shown, the repeater 205 can be implemented using other circuit configurations using the guidelines provided herein. Each of the nodes 104 further includes a skid buffer 212 disposed at the input side (as shown) or the output side of the node 104. The skid buffer 212 includes dual buffers 214, 216, multiplexing/demultiplexing circuitry 218, 220, and a controller 224, and operates to buffer incoming data packets received on the data wires 202 for forwarding downstream. The dual buffers 214, 216 allows the skid buffer 212 to buffer an incoming data packet while a previously received data packet is processed for subsequent downstream transmission.

Each node 104 further includes a node interface 225 that serves as the interface between the wire interconnect 106 of the node and the one or more components 110 of that node. The node interface 225 is coupled to the various wires of the wire interconnect 106 and operates to inject data packets for data received from the components 110 into the ring transport 102 for transmission to the downstream node, along with controlling the CLK_EN wire 206 and the valid wire 204 to provide the clock wake signal 116 that precedes the injected data packet and the valid signaling used to indicate the states of the data wires 202 represent valid data. On the receiving side, the node interface 225 operates to receive a clock wake signal 116 on the input side of the CLK_EN wire 206, and in response deactivate any clock gating applied to the ring clock signal 112 at the node 104 or the one or more components 110 so that the node 104 and one or more components 110 are activated and clocked in time for receipt of the data packet that is expected to follow receipt of the clock wake signal 116. If such a data packet does follow, the node interface 225 operates to determine if the data packet is intended for a component 110 associated with the node, and if so, provide a copy of the data of the data packet to the intended component 110.

Turning to the sleep controller 118, in one embodiment this component includes a state machine 226 and a set of count-down timers clocked by the ring clock signal 112 or clock derived therefrom, including an idle timer 228 and a suppression timer 230. The state machine 226 is implemented using hardcoded logic, programmable logic, a processor executing firmware or hardware, or a combination thereof. The state machine 226 has an input coupled to the input side of the CLK_EN wire 206 to monitor for receipt of clock wake signals 116 at the node 104-1, an input coupled to the input side of the valid wire 204 to monitor for receipt of valid data packets at the node 104-1 (recalling that assertion of the valid wire 204 signals that the "data" signaled by the data wires 202 is valid), and an output to provide a sleep signal 232 used to control the digital buffer 208 for the CLK_EN wire 206 such that if the sleep signal 232 is asserted (that is, SLEEP=1) and there is no incoming valid data packet (that is, VALID=0), then the digital buffer 208 is effectively disabled and thus does not repeat any received clock wake signal 116 while in this state (that is, suppresses or "squashes" any received clock wake signal 116). In the illustrated embodiment, this arrangement is implemented using an AND gate 234 disposed between the upstream segment of the CLK_EN wire 206 and the input of the digital buffer 208, whereby the AND gate 234 includes an inverted input to receive an inverted representation of the sleep signal 232, an input coupled to the upstream segment of the CLK_EN wire 206, and an output that serves as the input of the digital buffer 208 for the CLK_EN wire 206. In other embodiments, a different logic implementation is used in accordance with the teachings provided herein.

The operation of the state machine 226 in controlling the operation of the node 104-1 is represented by the illustrated state diagram 240, which includes four operational states: active state 242, idle state 244, clock suppression state 246, and dormant state 248. The state machine 226 monitors the CLK_EN wire 206 and the valid wire 204 as described above to detect the presence of clock wake signals 116 (CLK_EN) and data traffic passing through the node 104-1. While there is active data traffic, the state machine 226 remains in the active state 242, during which the sleep signal 232 is not asserted (or deasserted), and thus any received clock wake signals 116 are permitted to be forwarded by the repeater 205. If a clock wake signal 116 is received without a following data packet, then the state machine 226 enters the idle state 244. As with the active state 242, in the idle state the sleep signal 232 is not asserted and thus allowing received clock wake signals 116 to be forwarded to the downstream node. After occurrence of a specified idle condition, such as after the lapse of a first specified duration in the idle state 244 (as measured via the idle timer 228 without receipt of any data traffic at the node 104-1), the state machine 226 enters the clock suppression state 246. While in the clock suppression state 246, the sleep controller 118 actively suppresses any clock wake signals 116 received at the node 104-1 by asserting the sleep signal 232, which in turn effectively disables digital buffer 208 on the CLK_EN wire 206. This in turn prevents the repeater 205 from repeating any received clock wake signal 116 received at the input side of the node 104-1.

The state machine 226 remains in the clock suppression state 246 for a second specified duration unless data traffic is received at the node 104-1 (as measured via the suppression timer 230). This second specified duration, in one embodiment, is selected or otherwise specified to represent a duration expected to allow any errant clock wake signals 116 present in the ring transport 102 to reach the node 104-1 and subsequently be suppressed before entry into the dormant state 248 occurs. If data traffic is received while in the clock suppression state 246 and prior to lapse of the second specified duration, the state machine 226 returns to the active state. Otherwise, while in the dormant state 248, the node 104-1 switches to a clock-gated state and the state machine 226 deasserts the sleep signal 232 so as to permit downstream propagation of any received clock wake signals 116 by the repeater 205. If a clock wake signal 116 is received and followed by a data packet, then the state machine 226 returns to the active state 242. If a clock wake signal 116 is received and no data packet follows, then the state machine 226 returns to the idle state 244.

Figure 3:
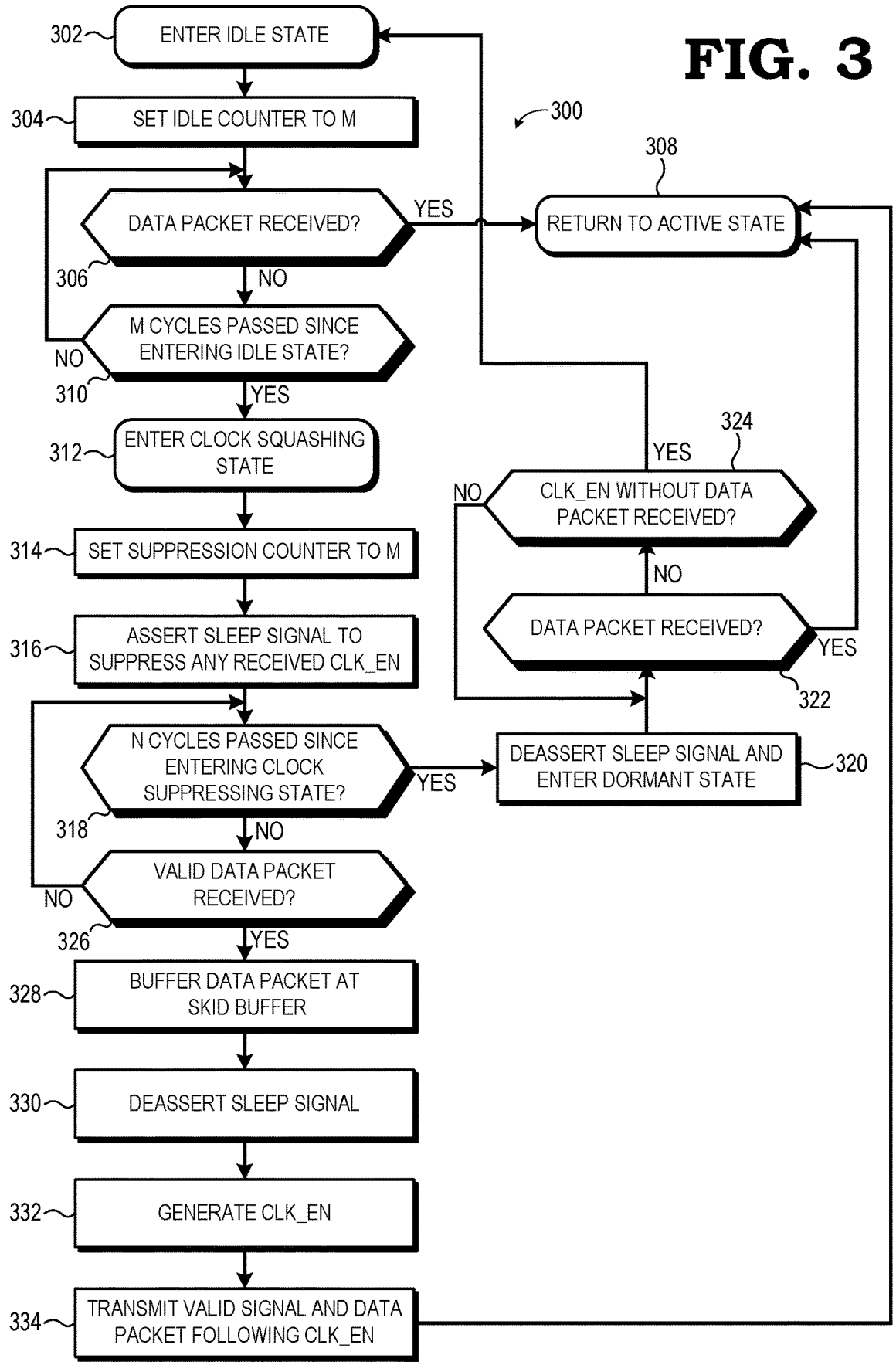
FIG. 3 is a flow diagram illustrating a method representative of a portion of a state diagram representing an operation of the sleep controller of FIGS. 1 and 2 in accordance with some embodiments of the present disclosure.

FIG. 3 illustrates a method 300 describing the idle-clock suppressing-dormant state transitions of the state machine 226 implemented by the sleep controller 118 in more detail in accordance with some embodiments. Note that while certain blocks are illustrated in a given order in FIG. 3, the processes represented by these blocks can be performed concurrently or in a different order. Block 302 represents the state machine 226 entering the idle state 244 after detecting receipt of a clock wake signal 116 that is not followed by a data packet. In response to entry into the idle state 244, at block 304 the state machine 226 resets the idle timer 228 to a value M representative of the first specified duration, which can be fixed or programmable and which is specified based on any of a variety of considerations, such as from modeling of an operation of the ring transport 102 or based on real-time feedback during actual operation of the ring transport 102. The idle timer 228 then counts down from M with every cycle of the ring clock signal 112. While the idle timer 228 has not elapsed, at block 306 the state machine 226 monitors for receipt of any data packets at the node 104-1. If a data packet is received, then at block 308 the state machine 226 returns to the active state 242. Otherwise, when M cycles have passed since entry into the idle state 244 (that is, the idle timer 228 has lapsed) as determined at block 310, the state machine 226 enters the clock suppression state 246 at block 312.

In response to entering the clock suppression state, at block 314 the state machine 226 resets the suppression timer 230 to a value N representative of the second specified duration, which is either fixed or programmable. In at least one embodiment, the value N is set as a time (measured in clock cycles) sufficient to allow all errant clock wake signals 116 present on the ring transport 102 to be suppressed at node 104-1. To illustrate, if it takes 20 clock cycles for a clock wake signal 116 to complete a circuit around the ring transport 102, then the value N could be set to a value slightly larger than 20, such as 22 for example, so as to allow sufficient time for any given errant clock wake signal 116 on the ring transport 102 to reach the node 104-1 so that it can be suppressed. Once reset to value N, the suppression timer 230 counts down from N with each cycle of the ring clock signal 112.

Further in response to entering the clock suppression state 246, the state machine 226 asserts the sleep signal 232 at block 316. Assertion of the sleep signal 232 in turn configures the digital buffer 208 on the CLK_EN wire 206 to refrain from repeating any received clock wake signal 116, and thus squashing or otherwise suppressing any errant clock wake signals 116 received at the node 104-1 while in the clock suppression state 246.

As represented by decision block 318, the state machine 226 monitors for the lapse of the suppression timer 230 (that is, whether N clock cycles have passed since entering the clock suppression state 246). If the suppression timer 230 has lapsed, then at block 320 the state machine 226 enters the dormant state 248 and deasserts the sleep signal 232. With the sleep signal 232 deasserted in the dormant state 248, the digital buffer 208 is activated and thus able to forward any clock wake signals 116 received from the upstream node 104 to the downstream node 104. Accordingly, at block 322 the state machine 226 monitors for receipt of a data packet at the node 104-1 and at block 324 the state machine 226 monitors for receipt of a clock wake signal 116 without a following data packet. If a data packet is received at the node 104-1 while in the dormant state 248, then the state machine 226 reverts to the active state 242 at block 308. If a clock wake signal 116 without a following data packet is received at the node 104-1 while in the dormant state 248, then the state machine reverts to the idle state 244 at block 302.

Returning to block 318, while the second specified period has not elapsed while in the clock suppression state 246, the state machine 226 monitors for receipt of a data packet at block 326. Recall that in the active, idle, and dormant states, there is no active clock wake signal suppression. As such, when a data packet is received at the node 104-1 in any of those states, the clock wake signal preceding the data packet is forwarded by the repeater 205 and then the received data packet is processed on the next clock cycle as usual. However, in the clock suppression state 246, clock wake signals are suppressed at the node 104-1. Accordingly, if a data packet is detected as received at the node 104-1 at block 326, this means that the clock wake signal that preceded the data packet was suppressed, and thus the data packet cannot be immediately processed and transmitted downstream as there is no repeated clock wake signal proceeding it. Instead, the node 104-1 generates a new clock wake signal 116 to precede the repeated data packet toward the downstream node 104-2.

Accordingly, in response to receipt of a data packet while in the clock suppression state 246, the data packet is buffered in one of the dual buffers 214, 216 of the skid buffer 212 at block 328, the sleep signal 232 is deasserted so as to reactivate the tristate digital buffer 208 on the CLK_EN wire 206 at block 330, and at block 332 the state machine 226 generates a clock wake signal 116 for transmission by the tristate digital buffer 208 to the downstream node 104-2 via the CLK_EN wire 206. For the clock cycle following generation of the clock wake signal 116, at block 334 the skid buffer outputs the buffered data packet on the data wires 202 and asserts the valid wire 204 so as to forward the data packet and valid signal downstream following the generated clock wake signal. Moreover, as there is a delay caused by having to recreate the suppressed clock wake signal 116 before the data packet can be repeated, it is possible that another data packet is received during this process. As such, the skid buffer 212 utilizes the other buffer to temporarily store this second received data packet until the first received packet has been transmitted, at which point the second data packet can be provided for forwarding to the next node 104-2 in the same manner, and so on.

In some embodiments, the apparatus and techniques described above are implemented in a system including one or more integrated circuit (IC) devices (also referred to as integrated circuit packages or microchips), such as the IC device 100 described above with reference to FIGS. 1-3. Electronic design automation (EDA) and computer aided design (CAD) software tools often are used in the design and fabrication of these IC devices. These design tools typically are represented as one or more software programs. The one or more software programs include code executable by a computer system to manipulate the computer system to operate on code representative of circuitry of one or more IC devices to perform at least a portion of a process to design or adapt a manufacturing system to fabricate the circuitry. This code includes instructions, data, or a combination of instructions and data. The software instructions representing a design tool or fabrication tool typically are stored in a computer readable storage medium accessible to the computing system. Likewise, the code representative of one or more phases of the design or fabrication of an IC device is either stored in and accessed from the same computer readable storage medium or a different computer readable storage medium.

A computer readable storage medium includes any non-transitory storage medium, or combination of non-transitory storage media, accessible by a computer system during use to provide instructions and/or data to the computer system. Such storage media include, but are not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium can be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

In some embodiments, certain aspects of the techniques described above are implemented by one or more processors of a processing system executing software. The software includes one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium can be in source code, assembly language code, object code, or other instruction format that is interpreted or otherwise executable by one or more processors.

In accordance with one aspect, a method includes monitoring, at a node of a ring transport of an integrated circuit (IC) device, a wire used to transmit clock wake signals around the ring transport. The method further includes configuring the node into a clock suppression state for a first specified duration responsive to identifying an idle condition on the ring transport via the monitoring of the wire, wherein while in the clock suppression state the node suppresses further transmission of any clock wake signals received at the node. In some embodiments, the method further includes, at each node of a plurality of nodes of the ring transport, switching from a clock gated state to a clocked state responsive to receiving a clock wake signal at the node.

In accordance with another aspect, an IC device includes a ring transport having a plurality of nodes and a wire interconnect coupling the plurality of nodes in a ring, the wire interconnect including a wire configured to transmit clock wake signals around the ring transport. The ring transport further includes a sleep controller coupled to a select node of the plurality of nodes, wherein the sleep controller is to configure the select node into a clock suppression state for a first specified duration responsive to identifying an idle condition on the ring transport via monitoring of the wire, wherein while in the clock suppression state the node suppresses further transmission of any clock wake signals received at the select node. In some embodiments, each node of the plurality of nodes is configured to switch from a clock gated state to a clocked state responsive to receiving a clock wake signal at the node. Further, in some embodiments, the idle condition comprises a lapse of a second specified duration since a clock wake signal without a following data packet was received at the select node. Moreover, in some embodiments, the first specified duration is represented by a first specified number of clock cycles of a clock signal used to clock the ring transport, the first specified number of clock cycles having a corresponding duration at least equal to a duration needed for a clock wake signal to circle the ring transport, and the second specified duration is represented by a second specified number of clock cycles of the clock signal. Further, in some embodiments, the sleep controller is to configure the select node into a dormant state responsive to a lapse of the first specified duration and to an absence of any data traffic received at the select node while in the clock suppression state, wherein while in the dormant state the select node is permitted to forward clock wake signals received at the select node.

In accordance with yet another aspect, a device includes a ring transport configured to transport data packets among a plurality of nodes, each node selectively clocked by clock signal and each data packet preceded in the ring transport by a clock wake signal. A select node of the plurality of nodes is configured to, responsive to the ring transport being idle for a first specified duration, suppress any clock wake signal received at the select node during a second specified duration following the first specified duration.

Note that not all of the activities or elements described above in the general description are required, that a portion of a specific activity or device may not be required, and that one or more further activities can be performed, or elements included, in addition to those described. Still further, the order in which activities are listed is not necessarily the order in which the activities are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter can be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above can be altered or modified and all such variations are considered within the scope of the disclosed subject matter. Accordingly, the protection sought herein is as set forth in the claims below.

What is claimed is:

1. A method, comprising:
monitoring, at a node of a ring transport of an integrated circuit (IC) device, a wire used to transmit clock wake signals around the ring transport; and
configuring the node into a clock suppression state for a first specified duration responsive to identifying an idle condition on the ring transport via the monitoring of the wire, wherein while in the clock suppression state the node suppresses further transmission of any clock wake signals received at the node,
wherein the idle condition comprises a lapse of a second specified duration since a clock wake signal was received at the node without a following data packet.

2. The method of claim 1, further comprising:
at each node of a plurality of nodes of the ring transport, switching from a clock gated state to a clocked state responsive to receiving a clock wake signal at the node.

3. The method of claim 1, further comprising:
configuring the first specified duration as a first specified number of clock cycles of a clock signal used to clock the ring transport, the first specified number of clock cycles having a corresponding duration at least equal to a duration needed for a clock wake signal to circle the ring transport; and
configuring the second specified duration as a second specified number of clock cycles of the clock signal.

4. The method of claim 1, further comprising:
responsive to a lapse of the first specified duration and to an absence of any data traffic received at the node while in the clock suppression state, configuring the node into a dormant state.

5. The method of claim 1, further comprising:
responsive to receipt of a first data packet at the node while in the clock suppression state:
buffering the first data packet at a first buffer of a skid buffer at the node;
generating a clock wake signal at the node and transmitting the clock wake signal to the next node in the ring transport; and
transmitting the first data packet from the first buffer to the next node following transmission of the generated clock wake signal.

6. The method of claim 5, further comprising:
responsive to receiving a second data packet at the node while buffering the first data packet:
buffering the second data packet at a second buffer of the skid buffer; and transmitting the second data packet to the next node following transmission of the first data packet.

7. An integrated circuit (IC) device, comprising:
a ring transport comprising:
  a plurality of nodes;
  a wire interconnect coupling the plurality of nodes in a ring, the wire interconnect including a wire configured to transmit clock wake signals around the ring transport; and
  a sleep controller coupled to a select node of the plurality of nodes, wherein the sleep controller is to configure the select node into a clock suppression state for a first specified duration responsive to identifying an idle condition on the ring transport via monitoring of the wire, wherein while in the clock suppression state the node suppresses further transmission of any clock wake signals received at the select node,
wherein the idle condition comprises a lapse of a second specified duration since a clock wake signal was received at the select node without a following data packet.

8. The IC device of claim 7, wherein:
each node of the plurality of nodes is configured to switch from a clock gated state to a clocked state responsive to receiving a clock wake signal at the node.

9. The IC device of claim 7, wherein:
the first specified duration is represented by a first specified number of clock cycles of a clock signal used to clock the ring transport, the first specified number of clock cycles having a corresponding duration at least equal to a duration needed for a clock wake signal to circle the ring transport; and
the second specified duration is represented by a second specified number of clock cycles of the clock signal.

10. The IC device of claim 7, wherein:
the sleep controller is to configure the select node into a dormant state responsive to a lapse of the first specified duration and to an absence of any data traffic received at the select node while in the clock suppression state, wherein while in the dormant state the select node is permitted to forward clock wake signals received at the select node.

11. The IC device of claim 7, wherein:
responsive to receipt of a first data packet at the select node while in the clock suppression state, the select node is to:
  buffer the first data packet at a first buffer of a skid buffer at the select node;
  generate a clock wake signal at the select node and transmit the clock wake signal to the next node in the ring transport; and
  transmit the first data packet from the first buffer to the next node following transmission of the generated clock wake signal.

12. The IC device of claim 11, wherein:
responsive to receiving a second data packet at the select node while buffering the first data packet, the select node is to:
  buffer the second data packet at a second buffer of the skid buffer; and
  transmit the second data packet to the next node following transmission of the first data packet.

13. The IC device of claim 7, wherein the IC device comprises a processor.

14. A device, comprising:
a ring transport configured to transport data packets among a plurality of nodes, each node selectively clocked by clock signal and each data packet preceded in the ring transport by a clock wake signal; and
wherein a select node of the plurality of nodes is configured to, responsive to the ring transport being idle for a first specified duration, suppress any clock wake signal received at the select node during a second specified duration following the first specified duration.

15. The device of claim 14, wherein:
each node of the plurality of nodes is configured to switch from a clock gated state to a clocked state responsive to receiving a clock wake signal at the node.

16. The device of claim 14, wherein:
the idle condition comprises a lapse of a second specified duration since a clock wake signal without a following data packet was received at the select node.

17. The device of claim 16, wherein:
the first specified duration is represented by a first specified number of clock cycles of the clock signal, the first specified number of clock cycles having a corresponding duration at least equal to a duration needed for a clock wake signal to circle the ring transport; and
the second specified duration is represented by a second specified number of clock cycles of the clock signal.

18. The device of claim 14, wherein:
responsive to receipt of a first data packet at the select node while suppressing clock wake signals, the select node is to:
  buffer the first data packet at a first buffer of a skid buffer at the select node;
  generate a clock wake signal at the select node and transmit the clock wake signal to the next node in the ring transport; and
  transmit the first data packet from the first buffer to the next node following transmission of the generated clock wake signal.

19. The device of claim 18, wherein:
responsive to receiving a second data packet at the select node while buffering the first data packet, the select node is to:
  buffer the second data packet at a second buffer of the skid buffer; and
  transmit the second data packet to the next node following transmission of the first data packet.

20. The method of claim 4, wherein the node is permitted to forward clock wake signals received at the node.

\* \* \* \* \*